(12) United States Patent
Herbst et al.

(10) Patent No.: US 11,021,406 B2
(45) Date of Patent: Jun. 1, 2021

(54) COPPER-CERAMIC COMPOSITE

(71) Applicant: Heraeus Deutschland GmbH & Co. KG, Hanau (DE)

(72) Inventors: Kai Herbst, Erlangen (DE); Christian Muschelknautz, Darmstadt (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 0 days.

(21) Appl. No.: 16/078,676

(22) PCT Filed: Feb. 16, 2017

(86) PCT No.: PCT/EP2017/053447
§ 371 (c)(1),
(2) Date: Aug. 22, 2018

(87) PCT Pub. No.: WO2017/144329
PCT Pub. Date: Aug. 31, 2017

(65) Prior Publication Data
US 2019/0084893 A1    Mar. 21, 2019

(30) Foreign Application Priority Data

Feb. 26, 2016    (DE) .......................... 102016203030.2

(51) Int. Cl.
*C04B 37/02*    (2006.01)
*H05K 3/24*    (2006.01)
*H05K 3/46*    (2006.01)

(52) U.S. Cl.
CPC ........... *C04B 37/021* (2013.01); *H05K 3/245* (2013.01); *H05K 3/4623* (2013.01);
(Continued)

(58) Field of Classification Search
CPC .............. C04B 37/021; C04B 2235/78; C04B 2237/706; C04B 2237/704;
(Continued)

(56) References Cited

U.S. PATENT DOCUMENTS 3,993,411 A * 11/1976 Babcock ................. C04B 37/02
403/271
4,987,677 A * 1/1991 Tanaka ................ H01L 21/4839
228/123.1
(Continued)

FOREIGN PATENT DOCUMENTS

CN    1049647 A    3/1991
CN    102167580 A    8/2011
(Continued)

OTHER PUBLICATIONS

"Research on Microstructure and Properties of Pure Copper Tube during Rolling Process", Guo, Advanced Materials Research¬, vols. 915-916, pp. 632-637, Apr. 2014, https://www.scientific.net/AMR.915-916.632 (Guo) (Year: 2014).*
(Continued)

*Primary Examiner* — Daniel J. Schleis
*Assistant Examiner* — Kevin Ct Li
(74) *Attorney, Agent, or Firm* — Blank Rome LLP

(57) ABSTRACT

The invention relates to a copper-ceramic composite comprising: a ceramic substrate; and a copper or copper alloy coating on the ceramic substrate, the copper or copper alloy having grain sizes of 10 μm to 300 μm.

18 Claims, 3 Drawing Sheets

(52) U.S. Cl.
CPC .... *C04B 2235/78* (2013.01); *C04B 2235/781* (2013.01); *C04B 2235/782* (2013.01); *C04B 2235/784* (2013.01); *C04B 2235/785* (2013.01); *C04B 2235/786* (2013.01); *C04B 2237/34* (2013.01); *C04B 2237/343* (2013.01); *C04B 2237/36* (2013.01); *C04B 2237/407* (2013.01); *C04B 2237/704* (2013.01); *C04B 2237/706* (2013.01)

(58) Field of Classification Search
CPC .......... C04B 2237/407; C04B 2237/36; C04B 2237/784; C04B 2237/343; C04B 2237/34; C04B 2235/786; C04B 2235/785; C04B 2235/782; C04B 2235/781; H05K 3/4623; H05K 3/245
See application file for complete search history.

(56) References Cited

U.S. PATENT DOCUMENTS

| | | | | |
|---|---|---|---|---|
| 2003/0219576 | A1* | 11/2003 | Elmoursi | H05K 3/102 428/210 |
| 2006/0083694 | A1 | 4/2006 | Kodas et al. | |
| 2012/0193324 | A1* | 8/2012 | Schulz-Harder | H05K 3/061 216/20 |
| 2014/0284088 | A1* | 9/2014 | Nakamura | H05K 1/092 174/257 |
| 2015/0366048 | A1* | 12/2015 | Nagase | H01L 23/3735 174/252 |

FOREIGN PATENT DOCUMENTS

| | | | | |
|---|---|---|---|---|
| CN | 102248168 | A | 11/2011 | |
| CN | 102339758 | A | 2/2012 | |
| CN | 203708628 | U | 7/2014 | |
| CN | 104919585 | A | 9/2015 | |
| DE | 4210900 | A1 | 10/1993 | |
| DE | 102012110322 | A1 | 4/2014 | |
| EP | 1365637 | A2 | 11/2003 | |
| JP | 01272183 | A * | 10/1989 | ....... H01L 23/49866 |
| JP | 2000281461 | A | 10/2000 | |
| JP | 2011124585 | A | 6/2011 | |
| WO | WO-1997000734 | A1 | 1/1997 | |
| WO | WO-2013015355 | A1 | 1/2013 | |
| WO | WO-2017097758 | A1 | 6/2017 | |

OTHER PUBLICATIONS

"A Concise Introduction to Ceramics", George Phillips, pp. 105, Oct. 17, 1991 (Phillips) (Year: 1991).*
Guo, et al., Research on Microstructure and Properties of Pure Copper Tube During Rolling Process, Advanced Materials Research, 2014, 915-919:632-637.
Feature Analysis and English Translation (2 pages).
Opposition Against European Patent EP3419950 and English Translation Dec. 29, 2020 (33 pages).
Sample Part System Plus—Module IGBT4 FS100R12PT4 and English Translation (10 Pages).
Mouser Electronic Invoice, Aug. 12, 2014.
SYSTEMPlus Consulting, Electronic Costing & Technology Experts, Reverse Costing Analysis, 2013, 106 pages.

* cited by examiner

COPPER-CERAMIC COMPOSITE

CROSS REFERENCE TO RELATED APPLICATIONS

This application is a national stage of International Patent Application No. PCT/EP2017/053447, filed Feb. 16, 2017, which claims the benefit of German Patent Application No. 10 2016 203 030.2, filed Feb. 26, 2016, each of which are hereby incorporated by reference in their entirety.

The present invention relates to a copper-ceramic composite and also a module which contains this composite and can be used in power electronics components.

Ceramic circuit boards are of particular interest in the field of high-power electronics because of their high thermal conductivity, high dimensional stability and mechanical strength and also their high insulation strength.

Various processes such as direct copper bonding (usually referred to as DCB process), direct aluminum bonding (usually referred to as DAB process) or active metal brazing (usually referred to as AMB process) are available for metallizing a ceramic substrate.

The composite material obtained after metallization of the ceramic substrate is also referred to as metal-ceramic substrate or metal-ceramic composite. If it has been produced, for example, by a DCB process, the term "DCB substrate" is frequently also used.

The DCB process exploits the fact that oxygen reduces the melting point of the copper from 1083° C. to the eutectic melting point of 1065° C. A thin eutectic melt layer is formed by the oxidation of copper foils before metallization of the ceramic substrate or by supply of oxygen during the high-temperature process (for example at a temperature in the range from 1065° C. to 1080° C.). This layer reacts with the surface of the ceramic substrate, so that ceramic and metal can be firmly joined to one another.

DCB processes are described, for example, in U.S. Pat. No. 3,744,120 or DE 23 19 854.

The metallization can, for example, be carried out on only one side of the ceramic substrate ("single layer bonding" SLB) or as an alternative simultaneously on both sides of the ceramic substrate ("double layer bonding" DLB). In addition, it is possible firstly to metallize a first side of the substrate by means of a first SLB step and subsequently also to metallize the opposite side of the substrate in a further SLB step.

Structuring the applied metal coating to form conductor tracks, for example by etching processes, is also known.

In many applications of power electronics, the metal-ceramic composite is subjected to high temperature change stresses in which significant temperature changes (e.g. in the range from −40° C. to +150° C.) can occur.

As a result of the different coefficients of thermal expansion of the ceramic substrate and of the metal coating, considerable mechanical stresses occur at the transition between these layers in the event of temperature fluctuations and these can ultimately lead to at least partial detachment of the metal from the ceramic surface. It is known that the gradient of the tensile and compressive stresses can be reduced, and the thermal shock resistance can thus be improved, by specific structuring of the metal layer in the peripheral region thereof. DE 40 04 844 and DE 4318241 A1 describe metal coatings on ceramic substrates, which have peripheral weakenings in the form of depressions or holes at their edges.

For further use in modules or components of high-power electronics, the metal coating can be joined to wires (frequently also referred to as "bond wires"). This connection between metal coating and bond wire should be very strong, so that the risk of undesirable detachment of the bond wire is minimized.

It is thus desirable in principle for the metal coating both to have good adhesion to the ceramic substrate and also to make good bonding of metal wires possible. However, since ceramic substrates and bond wires differ greatly in terms of their materials, it continues to remain a challenge to accommodate both requirements at the same time.

Further relevant properties of a copper-ceramic composite for applications in electronics are additionally the thermal conductivity and mechanical strength thereof (in particular the thermal conductivity and mechanical strength of the ceramic substrate) and also very firm bonding of the metal coating to the ceramic surface, with this bonding remaining sufficiently strong even under prolonged temperature change stresses.

In DE 10 2012 110 322, the ceramic substrate of the metal-ceramic composite is defined in more detail in respect of its grain structure (i.e. its structure at a microscopic level). The ceramic substrate contains an aluminum oxide reinforced with zirconium oxide, with the average grain size of the aluminum oxide being in the range of 2-8 μm and the ratio of the length of the grain boundaries of the $Al_2O_3$ grains to the total length of all grain boundaries being >0.6. According to DE 10 2012 110 322, this grain structure contributes to improving the thermal conductivity.

DETAILED DESCRIPTION OF THE INVENTION

It is an object of the present invention to provide a metal-ceramic composite having an improved property profile, in particular good thermal shock resistance and good wire bonding behavior.

The object is achieved by a copper-ceramic composite comprising
  a ceramic substrate,
  a coating which is present on the ceramic substrate and is composed of copper or a copper alloy, where the copper or the copper alloy has grain sizes in the range from 10 μm to 300 μm.

The copper coating of a copper-ceramic composite is generally a polycrystalline material which consists of small crystallites (which are also referred to as grains). On a microscopic level, polycrystalline materials can be characterized in more detail in terms of their grain structure (e.g. grain size distributions, shape of the grains, texture, . . . etc.).

In the context of the present invention, it has been established that a coating which is composed of copper or a copper alloy and has grain sizes in the range from 10 µm to 300 µm still displays good adhesion to a ceramic substrate even when the copper-ceramic composite is subjected to temperature change stresses over prolonged periods of time. At the same time, the copper or the copper alloy having these grain sizes allows efficient wire bonding.

According to the invention, thermal shock resistance is the resistance or the resistance capability of the copper layer to delamination from the ceramic of a copper-ceramic substrate, with the resistance being determined after at least one temperature change of the copper layer relative to the ceramic. An improved thermal shock resistance means that the number of temperature changes withstood increases.

According to the invention, improved wire bonding means that the force required to detach the bond wire from the copper surface of a copper-ceramic composite is increased.

Figure 2:
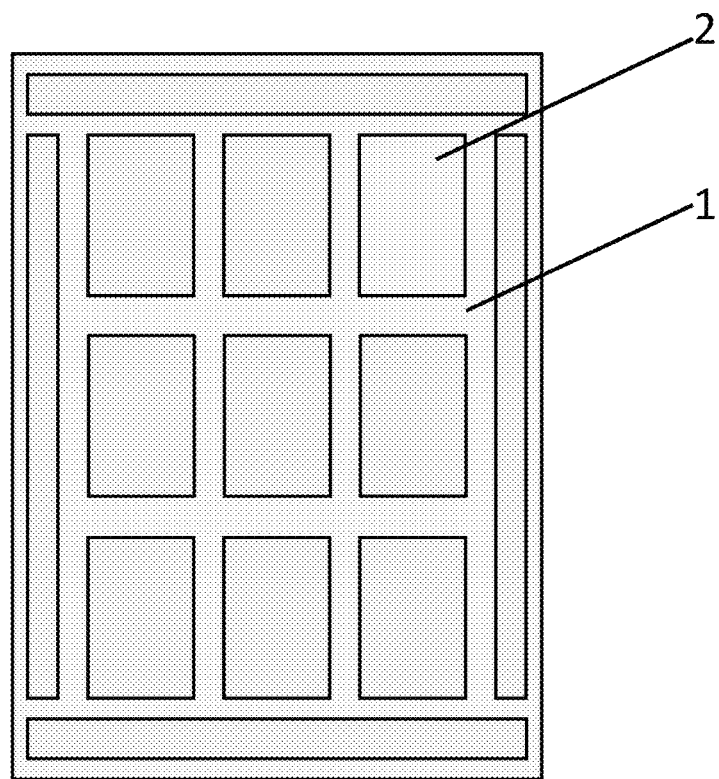
FIG. 2 is an illustration of another copper-ceramic composite.
Figure 3:
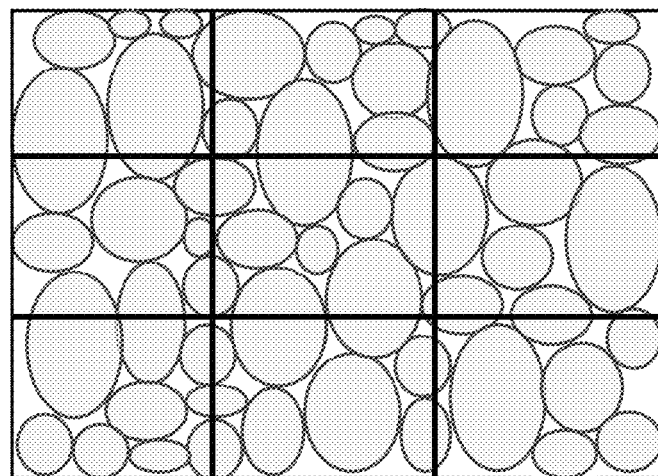
FIG. 3 is a schematic illustration of grains intersected by parallel lines in an x-direction and parallel lines in a y-direction for determination of grain size distribution.

According to the invention, improved copper adhesive strength is an adhesive strength of the copper relative to the copper-ceramic composite so that the force required to detach the bonded copper foil from the ceramic surface of a copper-ceramic composite is increased. An illustrative measurement method is known to a person skilled in the art from DE 102004012231 B4 (FIGS. 2 and 3 of DE 102004012231 B4).

According to the invention, improved flexural fracture strength of the ceramic means that the force leading to fracture in a three-point bending test is increased. The determination of the flexural fracture strength of the ceramic is, for example, known to a person skilled in the art from DIN EN 843-1 (2008). The specimen geometry preferably deviates from DIN EN 843-1 (2008) in that the specimens have dimensions of 20×40×0.38 mm$^3$ or 20×40×0.63 mm$^3$.

The grain sizes of the copper or of the copper alloy are preferably in the range from 15 µm to 250 µm, more preferably in the range from 20 µm to 210 µm.

For the purposes of the present invention, these values are not to be regarded as strict lower and upper limits for the grain size distribution, but instead can vary by +/−10%. However, in a preferred embodiment, these values are the lower limit, below which the grain size does not go, and the upper limit, which is not exceeded, of the grain size distribution of the copper or of the copper alloy. In this preferred embodiment, the copper or the copper alloy therefore has no grains which lie outside the abovementioned ranges. Preference is thus given to $d_{min}(Cu)$ being ≥10 µm and $d_{max}(Cu)$ being ≤300 µm, more preferably $d_{min}(Cu)$ being ≥15 µm and $d_{max}(Cu)$ being ≤250 µm, even more preferably $d_{min}(Cu)$ being ≥20 µm and $d_{max}(Cu)$ being ≤210 µm, where $d_{min}(Cu)$ and $d_{max}(Cu)$ are the minimum and maximum grain sizes of the copper.

The desired grain sizes in the copper-ceramic composite can be set by use of a copper starting foil having a suitable grain size distribution. Such copper foils are commercially available or can be obtained by standard methods. Fine adjustment of the grain sizes can optionally be carried out by thermal treatment of the starting foil.

As is known in principle to a person skilled in the art, the determination of the grain size distribution can be carried out on the basis of the number of grains (i.e. number distribution) or as an alternative on the basis of the mass (i.e. mass distribution) or the volume of the grains. For the purposes of the present invention, the distribution of the grain sizes is determined on the basis of the number of grains.

In a preferred embodiment, the copper or the copper alloy has a number distribution of the grain sizes in which not more than 5% of the grains have a grain size of less than 15 µm, preferably less than 20 µm, more preferably less than 25 µm; and/or in which at least 95% of the grains have a grain size of less than 250 µm, preferably less than 230 µm, more preferably less than 200 µm.

As is generally known, characteristic values of a grain size distribution are, inter alia, the $d_{50}$, $d_5$ and $d_{95}$ thereof. The $d_{50}$, which is frequently also referred to as median, is such that: 50% of the grains have a diameter which is smaller than the $d_{50}$.

Analogously, the $d_5$ is such that 5% of the grains have a diameter which is smaller than this $d_5$, and the $d_{95}$ is such that 95% of the grains have a diameter which is smaller than this $d_{95}$.

The arithmetic mean $d_{arith}$ of a grain size distribution is given by the sum of the grain sizes of the individual grains divided by the number of grains.

In the context of the present invention, it has surprisingly been found that further optimization of the thermal shock resistance and of the bonding behavior of the copper or the copper alloy can be achieved when the $d_5$ and $d_{95}$ values of the grain size distribution satisfy particular requirements.

The number distribution of the grain sizes of the copper or of the copper alloy preferably has a $d_{95}$ of ≤250 µm, more preferably in the range from 140 µm to 250 µm, even more preferably in the range from 140 µm to 230 µm, still more preferably in the range from 150 µm to 200 µm. The $d_5$ of the grain size number distribution of the copper or of the copper alloy is preferably ≥15 µm; the $d_5$ is more preferably in the range from 15 µm to 80 µm, even more preferably in the range from 20 µm to 75 µm, still more preferably in the range from 25 µm to 70 µm.

A preferred $d_{50}$ of the grain size number distribution of the copper or of the copper alloy is, for example, in the range from 55 µm to 115 µm.

In the context of the present invention, it can be preferred that the $d_5$, $d_{95}$ and $d_{50}$ values of the grain size number distribution of the copper or of the copper alloy are selected so that they satisfy the following condition:

$$4.0 \geq (d_{95}-d_5)/d_{50} \geq 0.5$$

The symmetry of a grain size distribution can be expressed by the ratio of median $d_{50}$ to the arithmetic mean $d_{arith}$ of this distribution (i.e. by the ratio $d_{50}/d_{arith}$; hereinafter also referred to as symmetry value S). The closer the symmetry value is to 1.0, the more symmetric is the grain size distribution. In a preferred embodiment, the copper or the copper alloy has a number distribution of the grain sizes having a median $d_{50}$ and an arithmetic mean $d_{arith}$ such that the ratio of $d_{50}$ to $d_{arith}$ (i.e. $d_{50}/d_{arith}$) is in the range from 0.75 to 1.10, more preferably in the range from 0.78 to 1.05, even more preferably in the range from 0.80 to 1.00. Further optimization of the thermal shock resistance and the wire bonding properties can be achieved in this way. Suitable methods by means of which the symmetry of the grain size distribution in the copper, for example already in the copper starting foil, can be set are known to those skilled in the art. For example, the symmetry of the grain size distribution in a copper foil can be influenced by a suitable processing temperature or a rolling process. Copper starting foils by means of which the abovementioned symmetry values can be realized in the final copper-ceramic composite are commercially available or can be obtained by standard methods.

The breadth of the grain size distribution can be expressed by the ratio of $d_5$ to $d_{95}$. In a preferred embodiment, the copper or the copper alloy has a number distribution of the grain sizes having a $d_5$ and a $d_{95}$ such that the ratio of $d_5$ to $d_{95}$ is in the range from 0.1 to 0.4, more preferably in the range from 0.11 to 0.35, even more preferably in the range from 0.12 to 0.30. Further optimization of the thermal shock resistance and the wire bonding properties can be achieved in this way.

Further optimization of the thermal shock resistance can be achieved when the grains of the copper coating have, in their two-dimensional projection in a plane parallel to the surface of the ceramic substrate, a shape which is preferably circular or round. The shape of an individual grain can be expressed by its shape factor $R_K$, which is the ratio of the maximum grain diameter $d_{K,max}$ to the grain diameter $d_{K,ortho}$ running perpendicular to $d_{K,max}$, determined on half the length of $d_{K,max}$ (i.e. $R_K = d_{K,ortho}/d_{K,max}$). The average grain shape factor $R_a(Cu)$ of the copper or of the copper alloy is obtained from the arithmetic mean of the shape factors $R_K$ of the grains. If a copper material contains, for example, a high proportion of elongated grains, the average grain shape factor of this copper will assume a relatively low value. On the other hand, the more the average grain shape factor approaches the value 1.0, the higher the proportion of round, circular grains.

The average grain shape factor $R_a(Cu)$ of the copper or of the copper alloy is preferably ≥0.40, more preferably ≥0.60, even more preferably ≥0.80. Suitable methods by means of which the shape of the grains in the copper can be set, for example as early as in the copper starting foil, are known to those skilled in the art. For example, the grain shape in a copper foil can be influenced by a suitable processing temperature or a rolling process. Copper starting foils by means of which the abovementioned average grain shape factor $R_a(Cu)$ can be realized in the final copper-ceramic composite are commercially available or can be obtained by standard methods.

A suitable thickness of the coating composed of copper or a copper alloy in a copper-ceramic composite is known to a person skilled in the art. As explained below, part of the copper or of the copper alloy can be removed at some places in the coating, in particular in peripheral regions, for example to form peripheral weak points. It is therefore possible in the context of the present invention for the thickness of the metal coating to vary. The coating composed of copper or a copper alloy usually has a thickness in the range of 0.2-1.2 mm over at least 70% of its area. For example, it is possible for the thickness to be about 300 μm.

The thickness of the coating composed of copper or a copper alloy ($D_{Cu}$) and the median $d_{50}$ of the grain size number distribution of the copper or of the copper alloy are preferably selected so that the ratio of $D_{Cu}$ to $d_{50}$ is in the range from 0.05 to 0.40. For this purpose, the thickness $D_{Cu}$ of the copper or of the copper alloy is determined at one place in the coating and divided by the median $d_{50}$ of the grain size number distribution of the copper or of the copper alloy. The ratio $D_{Cu}/d_{50}$ is preferably in the range from 0.05 to 0.40 over at least 70%, more preferably at least 90%, of the area of the coating composed of copper or a copper alloy.

The copper of the coating preferably has a purity of ≥99.50%, more preferably ≥99.90%, even more preferably ≥99.95% or even ≥99.99%.

The coating composed of copper or a copper alloy is preferably applied by means of a DCB process to the ceramic substrate. As explained above, a customary DCB process can, for example, have the following process steps:
 oxidizing a copper foil so as to form a copper oxide layer on the surface thereof;
 laying the copper foil with the copper oxide layer on the ceramic substrate;
 heating the composite to a temperature of <1083° C. (e.g. a temperature in the range of 1065-1080° C.),
 cooling to room temperature.

As a result of the DCB process, spinel crystallites (e.g. copper-aluminum spinels) can be present between the coating composed of copper or a copper alloy and the ceramic substrate.

Figure 1:
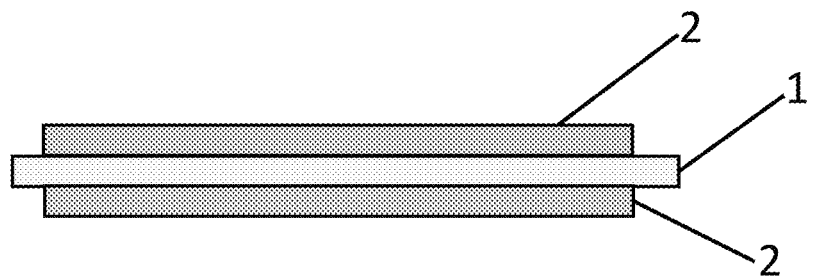
FIG. 1 is an illustration of a copper-ceramic composite.

The coating composed of copper or a copper alloy can, for example, have been applied on only one side of the ceramic substrate. As an alternative, it is possible for both sides (i.e. upper side and underside) of the ceramic substrate to be provided with the coating composed of copper or a copper alloy. An illustrative copper-ceramic composite in which a ceramic substrate 1 has a coating 2 composed of copper or a copper alloy on both its underside and also on its upper side is shown in FIG. 1. An illustrative copper-ceramic composite in which the ceramic substrate 1 has a plurality of regions which have each been provided with a coating 2 composed of copper or copper alloy is shown in FIG. 2. As explained below, the individual metallized regions can be separated from one another by preferential fracture lines (not shown in FIG. 2), so that these regions can be individualized by breaking along these preferential fracture lines.

To form electrical contact areas, the coating composed of copper or a copper alloy can at least partly have structuring. The structuring of the metal coating can be carried out in a known manner, in particular by means of an etching process (for example using an etching mask).

In the etching process, the copper or the copper alloy can be removed completely in subregions, so that the surface of the ceramic substrate is exposed in these subregions. Furthermore, it is also possible for the coating composed of copper or a copper alloy to have one or more depressions (preferably round depressions) which might be obtained in the etching process by the copper or the copper alloy being only partially removed in the region of the depression to be introduced and the surface of the ceramic substrate in this region therefore still being covered with copper or copper alloy. As an alternative or in addition, it is possible to etch the depressions through the copper or the copper alloy down to the ceramic surface. As regards the possible arrangement of such depressions, preferably in the peripheral region of the coatings composed of copper or copper alloy, reference may be made, for example, to DE 40 04 844 C1 and DE 43 18 241 A1.

Suitable materials for the ceramic substrate are known to those skilled in the art. The ceramic substrate preferably contains an oxide, a nitride, a carbide or a mixture or composite of at least two of these materials. The ceramic substrate can consist of only one layer or alternatively of a plurality of layers.

As suitable oxides, mention may be made by way of example of aluminum oxide ($Al_2O_3$) or BeO. If the oxide is an aluminum oxide, this can optionally be reinforced with zirconium oxide ($ZrO_2$). Such a $ZrO_2$-reinforced $Al_2O_3$ usually contains, based on its total mass, the zirconium oxide in a proportion of 0.5-30% by weight. The zirconium oxide can in turn optionally be doped with one or more doping oxide(s), in particular yttrium oxide, calcium oxide, cerium oxide or magnesium oxide, usually in a proportion of up to 0.01% by weight or even up to 5% by weight, based on the total mass of zirconium oxide and aluminum oxide.

If the ceramic substrate contains a nitride, this can be, for example, an aluminum nitride, a silicon nitride or a titanium nitride. For example, the ceramic substrate can be a multilayer ceramic substrate which contains at least one layer of aluminum nitride and at least one layer of $Al_2O_3$, with the coating composed of copper or a copper alloy being present on the layer of $Al_2O_3$.

If the ceramic substrate contains a carbide, this can be, for example, a silicon carbide.

In a preferred embodiment, the ceramic substrate contains aluminum oxide ($Al_2O_3$). As mentioned above, the aluminum oxide can be a $ZrO_2$-reinforced $Al_2O_3$.

The ceramic substrate preferably contains at least 65% by weight of $Al_2O_3$. If no $ZrO_2$ is present for reinforcing the $Al_2O_3$, the ceramic substrate may contain at least 95% by weight, preferably 96% by weight, of $Al_2O_3$.

If a $ZrO_2$-reinforced aluminum oxide is used (with the $ZrO_2$ optionally being doped, as mentioned above), the ceramic substrate may contain at least 96% by weight, preferably at least 98% by weight, of this $ZrO_2$-reinforced $Al_2O_3$.

The grain sizes of the aluminum oxide are preferably in the range from 0.01 μm to 25 μm, more preferably in the range from 0.3 μm to 23 μm, even more preferably in the range from 0.5 μm to 20 μm. With grain sizes in this range, the ceramic substrate of the copper-ceramic composite has both a high mechanical strength and also a high thermal conductivity. In the context of the present invention, these values are not to be regarded as strict lower and upper limits for the grain size distribution, but can instead vary by +/−10%. However, in a preferred embodiment, these values are the lower limit, below which the grain size does not go, and upper limit, which is not exceeded, of the grain size distribution of the aluminum oxide. In this preferred embodiment, the aluminum oxide therefore does not have any grains which lie outside the abovementioned ranges. Thus, preference is given to $d_{min}(Al_2O_3)$ being ≥0.01 μm and $d_{max}(Al_2O_3)$ being ≤25 μm, more preferably $d_{min}(Al_2O_3)$ being ≥0.3 μm and $d_{max}(Al_2O_3)$ being ≤23 μm, even more preferably $d_{min}(Al_2O_3)$ being ≥0.5 μm and $d_{max}(Al_2O_3)$ being ≤20 μm, where $d_{min}(Al_2O_3)$ and $d_{max}(Al_2O_3)$ are the minimum and maximum grain sizes of the aluminum oxide.

The desired $Al_2O_3$ grain sizes in the copper-ceramic composite can be set by use of a ceramic starting material having a suitable $Al_2O_3$ grain size distribution. Such ceramic materials are commercially available or can be obtained by standard methods. Fine adjustment of the grain sizes can optionally be carried out by thermal treatment of the ceramic starting material.

As mentioned above, the distribution of the grain sizes is, in the context of the present invention, determined on the basis of the number of grains (i.e. grain size number distribution).

In a preferred embodiment, the aluminum oxide of the ceramic substrate has a number distribution of the grain sizes in which not more than 5% of the grains have a grain size of less than 0.1 μm, more preferably less than 0.3 μm, even more preferably less than 0.5 μm; and/or in which at least 95% of the grains have a grain size of less than 15 μm, more preferably less than 10 μm, even more preferably less than 7 μm.

An improvement in or optimization of the mechanical strength and the thermal conductivity of the ceramic substrate in the metal-ceramic composite can be achieved when the $d_5$ and $d_{95}$ values of the grain size distribution of the $Al_2O_3$ satisfy particular requirements.

The number distribution of the grain sizes of the aluminum oxide preferably has a $d_{95}$ of ≤15.0 μm, more preferably in the range from 4.0 μm to 15.0 μm, even more preferably in the range from 4.5 μm to 10.0 μm, still more preferably in the range from 5.0 μm to 8.0 μm. The $d_5$ of the grain size number distribution of the aluminum oxide is preferably ≥0.1 μm; the $d_5$ is more preferably in the range from 0.1 μm to 2.5 μm, even more preferably in the range from 0.3 μm to 2.5 μm, still more preferably in the range from 0.5 μm to 2.0 μm. A further optimization of the mechanical strength and of the thermal conductivity of the ceramic substrate in the metal-ceramic composite can be achieved in this way.

A preferred $d_{50}$ of the grain size number distribution of the aluminum oxide is, for example, in the range from 1.0 μm to 3.0 μm.

In the context of the present invention, it can be preferred that the $d_5$, $d_{95}$ and $d_{50}$ values of the grain size number distribution of the aluminum oxide are selected so that they satisfy the following condition:

$$9.5 \geq (d_{95}-d_5)/d_{50} \geq 0.7$$

In a preferred embodiment, the aluminum oxide has a number distribution of the grain sizes having a median $d_{50}$ and an arithmetic mean $d_{arith}$ such that the ratio of $d_{50}$ to $d_{arith}$ (i.e. $d_{50}/d_{arith}$; hereinafter also referred to as symmetry value $S(Al_2O_3)$ of the grain size number distribution of the aluminum oxide) is in the range from 0.75 to 1.10, more preferably in the range from 0.78 to 1.05, even more preferably in the range from 0.80 to 1.00. Further optimization of the mechanical strength and thermal conductivity of the ceramic substrate in the metal-ceramic composite can be achieved in this way.

Suitable methods by means of which the symmetry of the grain size distribution in the aluminum oxide can be set, for example as early as in the production of the starting substrate, are known to those skilled in the art. For example, the symmetry of the grain size distribution can be influenced by sintering time and sintering temperature in the production of the starting substrate. $Al_2O_3$ substrates by means of which the abovementioned symmetry values can be realized in the final copper-ceramic composite are commercially available or can be obtained by standard methods.

The breadth of the grain size distribution can be expressed by the ratio of $d_5$ to $d_{95}$. In a preferred embodiment, the aluminum oxide has a number distribution of the grain sizes having a $d_5$ and a $d_{95}$ such that the ratio of $d_5$ to $d_{95}$ is in the range from 0.1 to 0.4, more preferably in the range from 0.11 to 0.35, even more preferably in the range from 0.12 to 0.30. Further optimization of the mechanical strength and thermal conductivity of the ceramic substrate in the metal-ceramic composite can be achieved in this way.

The average grain shape factor $R_a(Al_2O_3)$ of the aluminum oxide is preferably ≥0.40, more preferably ≥0.60, even more preferably ≥0.80. As indicated above, the shape of an individual grain can be expressed by its shape factor $R_K$, which is the ratio of the maximum grain diameter $d_{K,max}$ to the grain diameter $d_{K,ortho}$ running perpendicular to $d_{K,max}$, determined on half the length of $d_{K,max}$ (i.e. $R_K = d_{K,ortho}/d_{K,max}$). The average grain shape factor $R_a(Al_2O_3)$ of the aluminum oxide is obtained from the arithmetic mean of the shape factors $R_K$ of the grains. Suitable methods by means of which the shape of the aluminum oxide grains can be set, for example already in the production of the starting substrate, are known to those skilled in the art. For example, the shape of the $Al_2O_3$ grains can be influenced by sintering time and sintering temperature in the production of the starting substrate. $Al_2O_3$ substrates by means of which the abovementioned shape factor $R_a(Al_2O_3)$ can be realized in the final copper-ceramic composite are commercially available or can be obtained by standard methods.

A suitable thickness of the ceramic substrate in a copper-ceramic composite is known to a person skilled in the art. The ceramic substrate usually has a thickness in the range of 0.2-1.2 mm over at least 70% of its area, more preferably at least 90% of its area. A thickness of the ceramic substrate is, for example, about 0.38 mm or about 0.63 mm.

The thickness of the ceramic substrate ($D_{cer}$) and the median $d_{50}$ of the grain size number distribution of the aluminum oxide in the ceramic substrate are preferably selected so that the ratio of $D_{cer}$ to $d_{50}$ (i.e. $D_{cer}/d_{50}$) is in the range from 0.001 to 0.01, more preferably in the range from 0.002 to 0.009, even more preferably in the range from 0.004 to 0.008. For this purpose, the thickness $D_{cer}$ of the ceramic substrate is determined at one place and divided by the median $d_{50}$ of the grain size number distribution of the aluminum oxide. The ratio $D_{cer}/d_{50}$ is preferably in the range from 0.05 to 0.40 over at least 70%, preferably at least 90%, of the area of the ceramic substrate.

The ceramic substrate can have, for example, a thermal conductivity of $\geq 20$ W/mK, and/or a flexural fracture strength of $\geq 400$ MPa.

The ceramic substrate can be present in the form of an individual substrate. As an alternative, it is also possible for the ceramic substrate to have one or more (preferably linear) preferential fracture lines which divide the ceramic substrate into two or more regions and for the coating composed of copper or a copper alloy to have been applied in at least one of these regions. As regards the structure of such a multiple substrate having preferential fracture lines, reference may be made by way of example to DE 43 19 944 A1 and DE 199 27 046 A1.

Suitable dimensions (length×width) of the ceramic substrate (either as individual substrate or as multiple substrate) in a metal-ceramic composite are known to those skilled in the art. For example, the ceramic substrate can have dimensions, length×width, of (180-200 mm)×(130-150 mm) or (180-200 mm)×(270-290 mm). Smaller dimensions, for example (8-12 mm)×(8-12 mm), are also possible.

A further improvement in the properties of the copper-ceramic composite can be realized when the grain properties of the copper or of the copper alloy and the grain properties of the aluminum oxide in the ceramic substrate are matched to one another.

In a preferred embodiment, the ratio of $d_{50}(Al_2O_3)$ to $d_{50}(Cu)$ is in the range from 0.008 to 0.055, preferably in the range from 0.010 to 0.045. Further optimization of the metal-ceramic adhesion and the thermal shock resistance in the metal-ceramic composite can be achieved in this way.

In a preferred embodiment, the copper or the copper alloy has a number distribution of the grain sizes having a median $d_{50}$, an arithmetic mean $d_{arith}$ and a symmetry value $S(Cu)=d_{50}/d_{arith}$ and the aluminum oxide has a number distribution of the grain sizes having a median $d_{50}$, an arithmetic mean $d_{arith}$ and a symmetry value $S(Al_2O_3)=d_{50}/d_{arith}$, where $S(Al_2O_3)$ and $S(Cu)$ satisfy the following condition:

$$0.7 \leq S(Al_2O_3)/S(Cu) \leq 1.4.$$

More preferably, $S(Al_2O_3)$ and $S(Cu)$ satisfy the following condition:

$$0.74 \leq S(Al_2O_3)/S(Cu) \leq 1.35;$$

even more preferably the following condition $$0.80 \leq S(Al_2O_3)/S(Cu) \leq 1.25.$$

The thermal shock resistance of the copper-ceramic composite can be improved in this way.

In a preferred embodiment, the average grain shape factor of the aluminum oxide $R_a(Al_2O_3)$ and the average grain shape factor of the copper or of the copper alloy $R_a(Cu)$ satisfy the following condition:

$$0.5 \leq R_a(Al_2O_3)/R_a(Cu) \leq 2.0.$$

Greater preference is given to $$0.75 \leq R_a(Al_2O_3)/R_a(Cu) \leq 1.5$$

and even more preferably $$0.80 \leq R_a(Al_2O_3)/R_a(Cu) \leq 1.20.$$

Further optimization of the thermal shock resistance of the copper-ceramic composite can be realized in this way.

In a preferred embodiment, the aluminum oxide has grain sizes in the range from $d_{min}(Al_2O_3)$ to $d_{max}(Al_2O_3)$, the copper or the copper alloy has grain sizes in the range from $d_{min}(Cu)$ to $d_{max}(Cu)$ and the ratios of $d_{min}(Al_2O_3)$ to $d_{max}(Cu)$ and of $d_{max}(Al_2O_3)$ to $d_{min}(Cu)$ satisfy the conditions (i) and (ii) below:

$$d_{min}(Al_2O_3)/d_{max}(Cu) \geq 1 \times 10^{-5} \quad \text{(i) and}$$

$$2.5 \geq d_{max}(Al_2O_3)/d_{min}(Cu). \quad \text{(ii)}$$

The ratios of $d_{min}(Al_2O_3)$ to $d_{max}(Cu)$ and of $d_{max}(Al_2O_3)$ to $d_{min}(Cu)$ even more preferably satisfy the conditions (i) and (ii) below:

$$d_{min}(Al_2O_3)/d_{max}(Cu) \geq 0.001 \quad \text{(i) and}$$

$$1.5 \geq d_{max}(Al_2O_3)/d_{min}(Cu); \quad \text{(ii)}$$

and most preferably the conditions (i) and (ii) below:

$$d_{min}(Al_2O_3)/d_{max}(Cu) \geq 0.002 \quad \text{(i) and}$$

$$1.0 \geq d_{max}(Al_2O_3)/d_{min}(Cu). \quad \text{(ii)}$$

In a particularly preferred embodiment, $$0.005 \geq d_{min}(Al_2O_3)/d_{max}(Cu) \geq 0.002 \quad \text{(i) and}$$

$$1.0 \geq d_{max}(Al_2O_3)/d_{min}(Cu) \geq 0.05. \quad \text{(ii)}$$

A strong bond between the metal coating and the ceramic substrate which withstands even many temperature change stresses can be realized in this way. As mentioned above, preference is given to $d_{min}(Cu)$ being $\geq 10$ μm and $d_{max}(Cu)$ being $\leq 300$ μm, more preferably $d_{min}(Cu)$ are $\geq 15$ μm and $d_{max}(Cu)$ being $\leq 250$ μm, even more preferably $d_{min}(Cu)$ being $\geq 20$ μm and $d_{max}(Cu)$ being $\leq 210$ μm, where $d_{min}(Cu)$ and $d_{max}(Cu)$ being the minimum and maximum grain sizes of the copper.

The present invention further provides a module containing at least one copper-ceramic composite as described above and one or more bond wires. The bond wire or the bond wires are usually joined to the coating composed of copper or copper alloy. Suitable bonding methods for joining wires to a metal coating are known to those skilled in the art. The module can additionally contain one or more electronic components, e.g. one or more chips.

The grain structures of the copper or of the copper alloy and also of the aluminum oxide of the ceramic substrate are determined as follows in the context of the present invention:

Grain Size Distribution of the Copper or the Copper Alloy

An optical micrograph is taken of the surface of the coating composed of copper or a copper alloy (parallel to the coated substrate surface). Special specimen preparation in the form of a polished section is not necessary.

The grain sizes are determined by a line intersect method. Line intersect methods are known to those skilled in the art and are described, for example, in ASTM 112-13.

The magnification is selected so that at least 50 grains are intersected by the pattern of lines.

For the purposes of the present invention, in each case 2 parallel lines were drawn in the x direction and two parallel lines were drawn in the y direction in the optical micrograph. The lines divide the image in each case into three equally wide strips. For the purpose of illustration, this is schematically shown in FIG. 3.

When a grain is intersected over a length L by one of these lines, this length L is taken as grain size. A grain size is thus obtained for each grain intersected by one of these lines. At the crossing point of two lines, two values are obtained for one grain and these both go into the determination of the grain size distribution.

From the grain sizes of the intersected grains, there results a grain size distribution from which the $d_5$, $d_{50}$ and $d_{95}$ values and also the arithmetic mean $d_{arith}$ can in turn be determined.

As indicated above and generally known to those skilled in the art, the $d_{50}$, frequently also referred to as median, is defined as follows: 50% of the grains have a diameter which is smaller than the $d_{50}$. Analogously, the $d_5$ is such that 5% of the grains have a diameter which is smaller than this $d_5$, and the $d_{95}$ is such that 95% of the grains have a diameter which is smaller than this $d_{95}$.

The arithmetic mean of the grain size distribution is given by the sum of the grain sizes of the individual grains divided by the number of intersected grains.

Grain Size Distribution of the Aluminum Oxide of the Ceramic Substrate

A scanning electron micrograph (SEM image) is taken of the surface of the ceramic substrate. Special specimen preparation in the form of a polished section is not necessary. The SEM image is taken at a place on the ceramic substrate which was previously covered with copper and has been exposed by etching.

The grain sizes are determined by a line intersect method. Line intersect methods are known to those skilled in the art and are described, for example, in ASTM 112-13.

The magnification is selected so that at least 50 $Al_2O_3$ grains are intersected by the pattern of lines. If the ceramic substrate contains grains having a different chemical composition, for example $ZrO_2$ grains, these can readily be distinguished from the $Al_2O_3$ grains in the SEM image by means of secondary electron contrast and are thus not included in the subsequent calculations.

As regards the further evaluation by means of the line intersect method, reference may be made to what has been said above in respect of the copper coating.

Both the grain sizes of the copper or of the copper alloy and also the grain sizes of the $Al_2O_3$ are thus determined in a plane which runs parallel to the coated substrate surface or is coplanar with the latter.

Shape Factor of Individual Grains, Average Grain Shape Factor

Copper, Copper Alloy

The optical micrograph which was used in the determination of the grain size distribution is employed.

Figure 4:
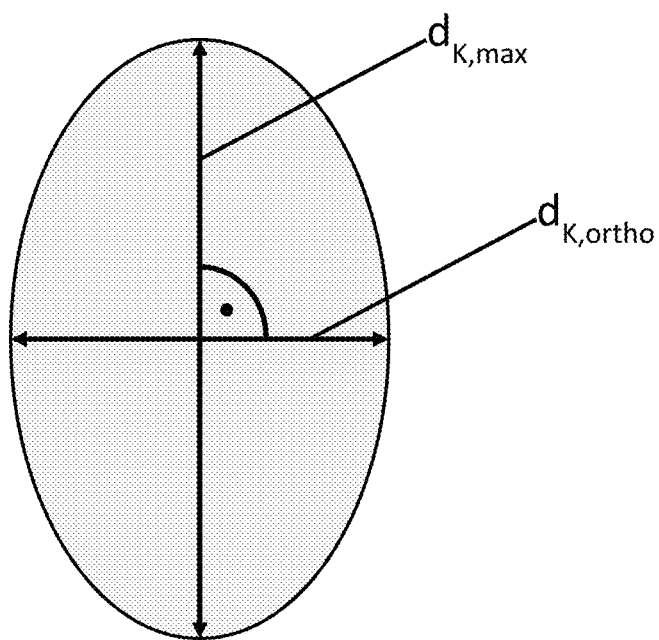
FIG. 4 is a schematic illustration showing the longest dimension $d_{K,max}$ and diameter $d_{K,ortho}$, of running perpendicular to $d_{K,max}$ for determination of the shape factor of an individual grain.

To determine the shape factor of an individual grain, the following procedure is employed:

The longest dimension $d_{K,max}$ thereof is determined. The grain diameter $d_{K,ortho}$ running perpendicular to $d_{K,max}$ is subsequently determined on half the length of $d_{K,max}$. The shape factor of the individual grain $R_K$ is given by the ratio of $d_{K,ortho}$ to $d_{K,max}$, i.e. $R_K = d_{K,ortho}/d_{K,max}$. This is shown schematically in FIG. 4 for a grain having an elliptical grain structure. The more closely the shape of a grain in its two-dimensional projection approaches that of a circle, the more closely does the shape factor of the grain approach the value 1.0. The shape factor is therefore also a measure of the circularity/roundness of the grains.

The shape factor is determined for at least 50 grains in the optical micrograph. The grains which were also intersected by the lines in the line intersect method are usually evaluated.

The average grain shape factor of the copper or of the copper alloy is then given by the arithmetic mean of the shape factors of the individual grains (i.e. sum of the individual shape factors divided by the number of grains examined).

Aluminum Oxide

The SEM image which was used in the determination of the grain size distribution is employed.

As regards the determination of the shape factor of individual grains and of the average grain shape factor of the $Al_2O_3$, reference may be made to what has been said above in respect of the copper.

Both the grain shape factors of the copper or of the copper alloy and also the grain shape factors of the $Al_2O_3$ are thus determined in a plane which runs parallel to the coated substrate surface or is coplanar with the latter.

A bonding process which is preferably used for producing the copper-ceramic substrates of the invention is described below:

A typical process which is preferably employed in the context of the present invention for applying the copper coating to the ceramic substrate is known, for example, from the documents U.S. Pat. No. 3,744,120, U.S. Pat. No. 3,994,430, EP 0 085 914 A or DE 23 19 854 A, the corresponding disclosure of which is incorporated by reference into the present invention.

It is common to these production processes disclosed there, for example in the Direct Copper Bonding process (DCB process), that a copper foil is firstly oxidized in such a way that an essentially uniform copper oxide layer is obtained. The resulting copper foil is then positioned on a ceramic substrate and the composite of ceramic substrate and copper foil is heated to a process or bonding temperature in the range from about 1025 to 1083° C., as a result of which a metallized ceramic substrate is formed. After bonding, the copper foil thus represents a coating. The resulting metallized ceramic substrate is subsequently cooled.

The joining of ceramic substrate and copper foil is carried out in a furnace, with bonding furnaces generally being used. Corresponding bonding furnaces, frequently also referred to as tunnel kilns, comprise, inter alia, an elongated tunnel-like furnace space (also referred to as muffle) and a transport device having a transport element, for example in the form of a flexible and heat-resistant conveyor belt, for transporting the material being treated through the furnace space which is heated by means of a heating device. The ceramic substrates are positioned together with the copper foil on a support on the conveyor belt and subsequently run through a heating region in the bonding furnace, in which the required bonding temperature is attained, driven by the conveyor belt. At the end of the bonding process, the resulting composite of ceramic substrate and copper foil according to the invention is cooled again.

This process can in principle be employed for producing ceramic substrates metallized on one side and also for producing substrates metallized on both sides. Here, the production of substrates metallized on both sides is generally carried out by a two-stage bonding process, i.e. by means of a two-stage single layer process (SLB process). In the context of the invention, preference is given to using a two-stage bonding process.

In this two-stage bonding process for producing ceramic substrates according to the invention which are metallized on both sides, the ceramic is joined to the copper foils on the opposite sides of the ceramic substrate in two passes through the furnace. For this purpose, a ceramic substrate is firstly positioned on a support and subsequently covered with a copper foil on the upper side, i.e. the side facing away from the support. This side of the ceramic substrate is joined to the metal layer by action of heat and the resulting arrangement is subsequently cooled. The substrate is subsequently turned over and the other side of the substrate is provided in the same way with a metal layer, i.e. the copper foil, in a second bonding step.

It is possible to produce individual cards or large cards which have a plurality of individual cards which can be broken out.

EXAMPLES

The following examples show how the grain size distribution in the copper coating influences the temperature change resistance and the wire bonding behavior of a copper-ceramic composite.

3 copper-ceramic specimens which differed in terms of their grain size distributions were produced by a DCB process:
copper-ceramic composite 1, hereinafter "K-K-V 1" (according to the invention)
copper-ceramic composite 2, hereinafter "K-K-V 2" (comparative specimen)
copper-ceramic composite 3, hereinafter "K-K-V 3" (comparative specimen)

Both the upper side and the underside of the ceramic substrate were provided with a copper coating in each of these 3 copper-ceramic composites. The copper coating was firstly bonded to one side of the ceramic substrate by means of the SLB process. The opposite side of the ceramic substrate was subsequently provided with a further copper coating by means of the SLB process so as to form a copper-ceramic substrate in which a copper foil is bonded to both sides of the ceramic. One of the two copper coatings was in each case subsequently structured by an etching process in each specimen (same structuring for all specimens).

In each of these 3 copper-ceramic composites, the thickness of the copper coating was 0.3 mm and the length×width of the copper coating was: 181×132 mm². In the example, the copper is pure copper.

Furthermore, all 3 specimens contained an $Al_2O_3$ ceramic substrate ($Al_2O_3$ content: 96% by weight), thickness of the ceramic substrate: 0.38 mm; length×width of the ceramic substrate: 190×140 mm².

The copper coating was selected so that the effect according to the invention, namely good thermal shock resistance, was realized after the two-stage SLB bonding (copper-ceramic substrate according to the invention) and good bonding of wires to the metal coating was realized after the two-stage SLB bonding (copper-ceramic substrate according to the invention).

The copper coating of K-K-V 1 had grain sizes in the range from 32 μm (i.e. lower limit of the grain size distribution) to 192 μm (i.e. upper limit of the grain size distribution). The $d_5$ of the grain size distribution was 49 μm and the $d_{95}$ was 177 μm. The $d_{50}$ of the grain size distribution was 98 μm.

Figure 5:
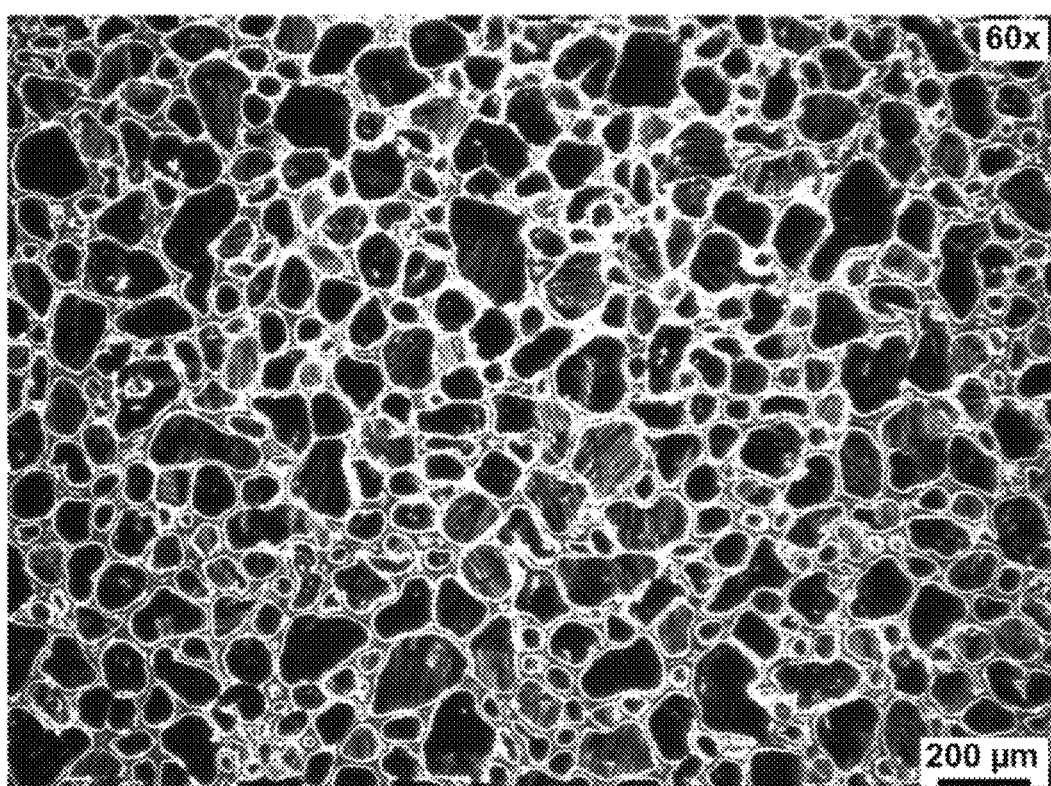
FIG. 5 is an optical micrograph of the surface of the copper coating of a copper-ceramic composite according to the invention, by means of which copper grain sizes of the copper-ceramic composite were determined.

FIG. 5 shows an optical micrograph of the surface of the copper coating of K-K-V 1, by means of which the copper grain sizes of the example K-K-V 1 were determined.

The copper coating of K-K-V 2 had grain sizes in the range from 4 μm (i.e. lower limit of the grain size distribution) to 175 μm (i.e. upper limit of the grain size distribution). The $d_5$ of the grain size distribution was 13 μm and the $d_{95}$ was 154 μm. The $d_{50}$ of the grain size distribution was 42 μm.

The copper coating of K-K-V 3 had grain sizes in the range from 43 μm (i.e. lower limit of the grain size distribution) to 470 μm (i.e. upper limit of the grain size distribution). The $d_5$ of the grain size distribution was 72 μm and the $d_{95}$ was 293 μm. The $d_{50}$ of the grain size distribution was 156 μm.

Both the thermal shock resistance and also the wire bonding properties were determined for each of these 3 specimens.

The thermal shock resistance was determined as follows:
To determine the thermal shock resistance of the copper-ceramic substrate, an individual substrate is preferably broken out from a large card. The individual substrate was subjected in an apparatus known to those skilled in the art to a temperature change cycle which was made up of:
storage at 150° C. (preferably in a first chamber of a temperature change cabinet) for 15 minutes
storage at −40° C. (minus 40° C.) (preferably in a second chamber of the temperature change cabinet) for 15 minutes,
with a transfer time of 15 seconds occurring in the transfer from one chamber into the other chamber.

Over the course of 5 cycles (storage at 150° C. to −40° C. and back corresponding to one cycle), the area of the join at the interface between copper and ceramic was in each case examined for delamination by means of an ultrasonic microscope.

In the case of the specimen K-K-V 1 according to the invention, significantly reduced delamination was found compared to the specimens K-K-V 2 and K-K-V 3.

The wire bonding properties were determined as follows:
To determine the wire bonding properties of the copper-ceramic substrate, an individual substrate is preferably broken out from a large card. A wire (in the example a copper wire, for example, according to methods known to those skilled in the art) was bonded to the individual substrate on the copper surface of the bonded copper-ceramic substrate in an apparatus known to those skilled in the art. In the context of the invention, it could be established, according to the invention, that, when the product parameters and the subsequent DCB process were selected according to the invention, the specimen K-K-V 1 had significantly improved wire bonding properties compared to the specimens K-K-V 2 and K-K-V 3.

The results are summarized in the following table:

TABLE

Thermal shock resistance and wire bonding properties of the copper-ceramic composites

| | | Thermal shock resistance | Wire bonding |
|---|---|---|---|
| Specimen K-K-V 1 (according to the invention) | Grain size range: 32-192 μm<br>$d_5$: 49 μm<br>$d_{95}$: 177 μm<br>$d_{50}$: 98 μm | + | + |

TABLE-continued

Thermal shock resistance and wire bonding properties of the copper-ceramic composites

|  |  | Thermal shock resistance | Wire bonding |
|---|---|---|---|
| Specimen K-K-V 2 (comparison) | Grain size range: 4-175 µm<br>$d_5$: 13 µm<br>$d_{95}$: 154 µm<br>$d_{50}$: 42 µm | − | + |
| Specimen K-K-V 3 (comparison) | Grain size range: 43-470 µm<br>$d_5$: 72 µm<br>$d_{95}$: 293 µm<br>$d_{50}$: 156 µm | + | − |

As the examples demonstrate, a simultaneous improvement in thermal shock resistance and wire bonding is achieved only in the case of the grain size distribution according to the invention, in particular by complying with the $d_5$ and $d_{95}$ values according to the invention.

The invention claimed is:

1. A copper-ceramic composite comprising:
   a ceramic substrate,
   a coating which is present on the ceramic substrate and is composed of copper or a copper alloy,
   wherein the copper or the copper alloy has
       grain sizes in the range from 10 µm to 300 µm;
       a grain size number distribution having a $d_{95}$ in the range from 140 µm to 250 µm; and
       an average grain shape factor $R_a(Cu)$ of greater than or equal to 0.60, wherein the average grain shape factor $R_a(Cu)$ is obtained from the arithmetic mean of the shape factors $R_K$ of the individual grains, the shape factor $R_K$ of each individual grain being $d_{K,ortho}/d_{K,max}$, wherein $d_{K,max}$ is the maximum grain diameter and $d_{K,ortho}$ is the grain diameter running perpendicular to $d_{K,max}$, determined on half the length of $d_{K,max}$, and
   wherein the coating composed of copper or a copper alloy is applied by means of a DCB process to the ceramic substrate.

2. The copper-ceramic composite of claim 1, wherein the copper or the copper alloy has a number distribution of the grain sizes having a median $d_{50}$ in the range from 55 µm to 115 µm.

3. The copper-ceramic composite of claim 1, wherein the $d_{95}$ is in the range from 140 µm to 230 µm.

4. The copper-ceramic composite of claim 1, wherein the grain size number distribution of the copper or the copper alloy has a $d_5$ of greater than or equal to 15 µm.

5. The copper-ceramic composite of claim 1, wherein the grain sizes of the copper or of the copper alloy are in the range from 15 µm to 250 µm.

6. The copper-ceramic composite of claim 1, wherein the coating composed of copper or a copper alloy has a thickness $D_{Cu}$ and the grain size number distribution of the copper or the copper alloy has a median $d_{50}$ value, the ratio of the $D_{Cu}$ to the median $d_{50}$ value being in the range from 0.05 to 0.40, wherein the thickness $D_{Cu}$ and the median $d_{50}$ value have the same unit of measure for determination of the ratio of the $D_{Cu}$ to the median $d_{50}$ value.

7. The copper-ceramic composite of claim 1, wherein the coating composed of copper or a copper alloy at least partly has structuring to form electrical contact areas.

8. The copper-ceramic composite of claim 1, wherein the ceramic substrate contains an oxide, a nitride, a carbide or a mixture or composite of at least two of these materials.

9. The copper-ceramic composite of claim 1, wherein the ceramic substrate contains at least 65% by weight of $Al_2O_3$.

10. The copper-ceramic composite of claim 1, wherein the coating composed of copper or a copper alloy has a thickness in the range of 0.2-1.2 mm over at least 70% of its area.

11. A module containing at least one copper-ceramic composite according to claim 1 and one or more bond wires.

12. The copper-ceramic composite of claim 4, wherein the $d_5$ is in the range from 15 µm to 80 µm.

13. The copper-ceramic composite of claim 10, wherein the ceramic substrate has a thickness in the range of 0.2-1.2 mm over at least 70% of its area.

14. The copper-ceramic composite of claim 1, wherein the ceramic substrate has a thickness in the range of 0.2-1.2 mm over at least 70% of its area.

15. The copper-ceramic composite of claim 1, wherein the average grain shape factor $R_a(Cu)$ of the copper or the copper alloy is greater than or equal to 0.60 and less than or equal to 1.0.

16. The copper-ceramic composite of claim 1, further comprising copper-aluminum spinels located between the ceramic substrate and the coating.

17. The copper-ceramic composite of claim 9, wherein the $Al_2O_3$ is in the form of grains, the grains having
   grain sizes in the range from 0.01 µm to 25 µm; and
   a grain size number distribution having a $d_{95}$ in the range from 4.0 µm to 15.0 µm.

18. The copper-ceramic composite of claim 9, wherein the $Al_2O_3$ grains have an average grain shape factor $R_a(Al_2O_3)$ of greater than or equal to 0.40, wherein the average grain shape factor $R_a(Al_2O_3)$ is obtained from the arithmetic mean of the shape factors $R_K$ of the individual grains, the shape factor $R_K$ of each individual grain being $d_{K,ortho}/d_{K,max}$, wherein $d_{K,max}$ is the maximum grain diameter and $d_{K,ortho}$ is the grain diameter running perpendicular to $d_{K,max}$, determined on half the length of $d_{K,max}$.

* * * * *